(12) United States Patent
Chien

(10) Patent No.: US 6,556,498 B2
(45) Date of Patent: Apr. 29, 2003

(54) OPERATION METHOD OF A SRAM DEVICE

(76) Inventor: Pien Chien, No. 50, Alley 111, Lane 155, Sec. 3, Keelung Rd., Taipei (TW)

(*) Notice: Subject to any disclaimer, the term of this patent is extended or adjusted under 35 U.S.C. 154(b) by 0 days.

(21) Appl. No.: 10/047,765

(22) Filed: Jan. 14, 2002

(65) Prior Publication Data

US 2002/0101776 A1 Aug. 1, 2002

Related U.S. Application Data

(60) Provisional application No. 60/262,988, filed on Jan. 19, 2001, provisional application No. 60/301,637, filed on Jun. 27, 2001, provisional application No. 60/286,395, filed on Apr. 25, 2001, provisional application No. 60/301,691, filed on Jun. 27, 2001, provisional application No. 60/300,000, filed on Jun. 21, 2001, provisional application No. 60/300,483, filed on Jun. 22, 2001, provisional application No. 60/318,793, filed on Sep. 10, 2001, and provisional application No. 60/324,794, filed on Sep. 24, 2001.

(51) Int. Cl.[7] ................................................ G11C 7/00
(52) U.S. Cl. ................... 365/222; 365/233.5; 365/233; 365/189.01
(58) Field of Search ............................... 365/222, 233.5, 365/233, 189.05, 230.08, 241, 189.01

(56) References Cited

U.S. PATENT DOCUMENTS 6,256,248 B1 * 7/2001 Leung ........................ 365/222

* cited by examiner

*Primary Examiner*—David Lam
(74) *Attorney, Agent, or Firm*—J. C. Patents

(57) ABSTRACT

An operation method for a static random access memory (SRAM) device. The SRAM device has a plurality of memory cells. Each of the memory cells is periodically refreshed to retain valid data. The operation method comprising receiving an access address and a refresh address for the SRAM device and detecting whether a transition pulse and a refresh pulse being generated. The access address is used for accessing data stored in the SRAM device and the refresh address is used for periodically refreshing the memory cell in the SRAM. The transition pulse is generated by an address transition detector when a read/write operation is issued. The refresh pulse is generated in response to a refresh clock being in an active state.

9 Claims, 10 Drawing Sheets

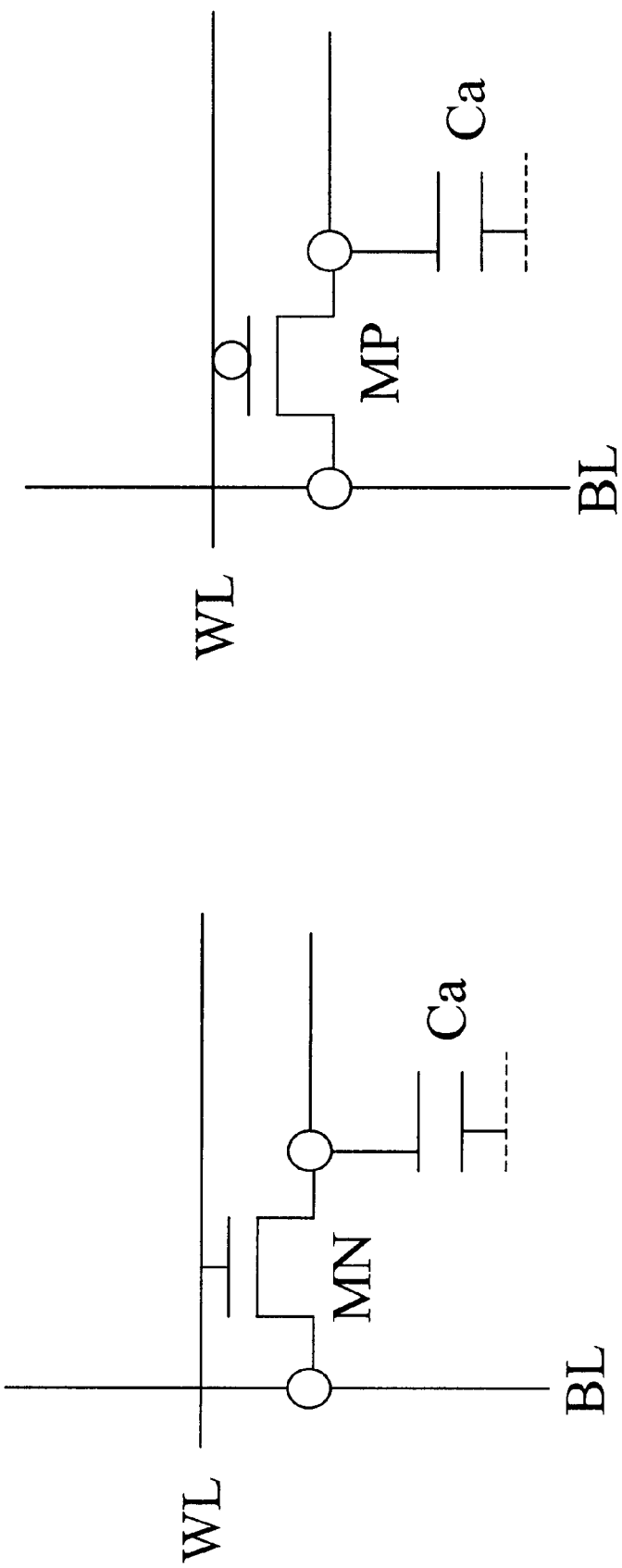

OPERATION METHOD OF A SRAM DEVICE

CROSS-REFERENCE TO RELATED APPLICATION

This application claims the priority benefits of U.S. provisional application titled "1-T SRAM Device" filed on Jan. 19, 2001, serial No. 60/262,988, U.S. provisional application titled "1-T SRAM" filed on Jun. 27, 2001, serial No. 60/301,637, U.S. provisional application titled "HIGH SPEED MULTI-PORT MEMORY DEVICE" filed on Apr. 25, 2001, serial No. 60/286,395, U.S. provisional application titled "HIGH SPEED MULTI-PORT MEMORY DEVICE" filed on Jun. 27, 2001, serial No. 60/301,691,U.S. patent application titled "CONTENT ADDRESSABLE MEMORY (CAM) APPARATUS AND A METHOD OF OPERATING THE SAME" filed on Jun. 26, 2001, Ser. No. 09/899,555, U.S. provisional application titled "CONTENT ADDRESSABLE MEMORY (CAM) CELL" filed on Jun. 21, 2001, Ser. No. 60/300,000, U.S. provisional application titled "CONTENT ADDRESSABLE MEMORY (CAM) CELL" filed on Jun. 22, 2001, serial No. 60/300,483, U.S. provisional application titled "CONTENT ADDRESSABLE MEMORY (CAM) CELL" filed on Sep. 10, 2001, serial No. 60/318,793 and U.S. provisional application titled "CONTENT ADDRESSABLE MEMORY (CAM) CELL" filed on Sep. 24, 2001, serial No. 60/324,794. All disclosures of these applications are incorporated herein by reference.

BACKGROUND OF THE INVENTION

1. Field of the Invention

The present invention relates to an operation method of an SRAM (Static Random Access Memory) device. More particularly, the present invention relates to an operation of a SRAM, which can efficiently perform read/write accessing operations and refresh operation for such SRAM device.

2. Description of the Related Art

Some conventional semiconductor memories, such as dynamic random access memory (DRAM), must be periodically refreshed in order to retain valid data. During refresh operations, external accessing data typically is not allowed. In addition, a mechanism is required to inform the memory controller that the DRAM is performing a refresh operation. Any pending memory transaction has to be delayed until the refresh operation is completed. Refresh operations therefore lengthen the overall access time for memory accesses. It is therefore important to design a memory system in which the impact of refresh operations on external memory access is minimized.

SUMMARY OF THE INVENTION

The present invention provides an operation method for a SRAM device which can statically maintains valid data with a benefit that refresh operations required by the 1-T SRAM do not interfere with any external access of the 1-T SRAM under any situation.

To achieve the objective mentioned above, the present invention provides an operation method for a static random access memory (SRAM) device. The SRAM device has a plurality of memory cells, each of the memory cells is periodically refreshed to retain valid data. The operation method comprising steps of receiving an access address and a refresh address for the SRAM device and detecting whether a transition pulse and a refresh pulse being generated. The access address is used for accessing data stored in the SRAM device and the refresh address is used for periodically refreshing the memory cell in the SRAM. The transition pulse is generated by an address transition detector when a read/write operation is issued. The refresh pulse is generated in response to a refresh clock being in an active state. If the transition pulse is generated before the refresh pulse being generated within a first time period, the access address is used to access data stored in the SRAM device at the time of the rising edge of the transition pulse. The refresh address is used to refresh the memory cell of the SRAM device in accordance with the refresh address at least the first period later after the rising edge of the transition pulse being issued. The first time period is a time period sufficient enough to accomplish the read/write operation.

If the refresh pulse is generated before the transition pulse is generated within a second time period, the refresh address is used to refresh the memory cells of the SRAM device in accordance with the refresh address at the time of the rising edge of the refresh pulse. The access address is used to access data stored in the memory cell of the SRAM device in accordance with the access address at least the second period later after the rising edge of the refresh pulse being issued. The second time period is a time period sufficient enough to accomplish the refresh operation.

In the above-described operation method of a SRAM device, in the step of detecting whether the transition pulse and the refresh pulse being generated, if the transition pulse is generated before the refresh pulse being generated larger than the first time period, the access address is used to access data stored in the SRAM device at the time of the rising edge of the transition pulse, the refresh address is used to refresh the memory cell of the SRAM device in accordance with the refresh address after the read/write operation being accomplished.

In the above-described operation method of a SRAM device, in the step of detecting whether the transition pulse and the refresh pulse being generated, if the refresh pulse is generated before the transition pulse is generated larger than the second time period, the refresh address is used to refresh the memory cells of the SRAM device in accordance with the refresh address at the time of the rising edge of the refresh pulse. The access address is used to access data stored in the memory cell of the SRAM device in accordance with the access address after the refresh operation being accomplished.

To achieve the objective mentioned above, the present invention provides an operation method of a static random access memory (SRAM) device. The SRAM device has a plurality of memory cells, each of the memory cells is periodically refreshed to retain valid data. The operation method comprising steps of receiving an access address and a refresh address for the SRAM device and detecting whether a transition pulse and a refresh pulse being generated. The access address is used for accessing data stored in the SRAM device and the refresh address is used for periodically refreshing the memory cell in the SRAM. The transition pulse is generated in response to a read/write operation being issued, and the refresh pulse is generated in response to a refresh clock being transited to an active state.

If the transition pulse is generated before the refresh pulse being generated, the access address is used to access data stored in the SRAM device at the time of the rising edge of the transition pulse. The refresh address is used to refresh the memory cell of the SRAM device in accordance with the refresh address after the read/write operation being accomplished.

If the refresh pulse is generated before the transition pulse being generated, the refresh address is used to refresh the memory cells of the SRAM device in accordance with the refresh address at the time of the rising edge of the refresh pulse, the access address is used to access data stored in the memory cell of the SRAM device in accordance with the access address after the refresh operation being accomplished.

In the above-described operation method of a SRAM device, in the step of detecting whether the transition pulse and the refresh pulse being generated, if the transition pulse is generated before the refresh pulse being generated larger than the first time period, the access address is used to access data stored in the SRAM device at the time of the rising edge of the transition pulse, the refresh address is used to refresh the memory cell of the SRAM device in accordance with the refresh address after the read/write operation being accomplished.

In the above-described operation method of a SRAM device, in the step of detecting whether the transition pulse and the refresh pulse being generated, if the refresh pulse is generated before the transition pulse is generated larger than the second time period, the refresh address is used to refresh the memory cells of the SRAM device in accordance with the refresh address at the time of the rising edge of the refresh pulse. The access address is used to access data stored in the memory cell of the SRAM device in accordance with the access address after the refresh operation being accomplished.

To achieve the objective mentioned above, the present invention provides an operation method of a static random access memory (SRAM) device. The SRAM device has a plurality of memory cells, each of the memory cells is periodically refreshed to retain valid data. The operation method comprising receiving an access address, a refresh address and a chip deselected signal for the SRAM device and detecting the chip deselected signal being in an active state and detecting whether a transition pulse and a refresh pulse being generated. The access address is used for accessing data stored in the SRAM device and the refresh address is used for periodically refreshing the memory cell in the SRAM device. The chip deselected signal is used to indicate the SRAM device being selected for data processing. The transition pulse is generated in response to a read/write operation being issued. The refresh pulse is generated in response to a refresh clock being transited to an active state.

If the deselected signal is not in the active state and the transition pulse is generated before the refresh pulse being generated, the access address is used to access data stored in the SRAM device at the time of the rising edge of the transition pulse. The refresh address is used to refresh the memory cell of the SRAM device in accordance with the refresh address after the read/write operation being accomplished.

If the deselected signal is in the active state or if the refresh pulse is generated before the transition pulse being generated, the refresh address is used to refresh the memory cells of the SRAM device in accordance with the refresh address at the time of the rising edge of the refresh pulse.

It is to be understood that both forgoing general description and the following detailed description are exemplary, and intended to provide further explanation of the invention as claimed.

BRIEF DESCRIPTION OF THE DRAWINGS

The accompanying drawings are included to provide a further understanding of the invention, and are incorporated in and constitute a part of this specification. The drawing illustrate embodiments of the invention and, together with the description, serve to explain the principles if the invention. In the drawings, FIGS. 1A, 1B, 1C, 2A and 2B are dynamically storing memory cells with only one transistor and one capacitor;

DESCRIPTION OF THE PREFERRED EMBODIMENT

As embodied in the invention, an operation method of a 1-T (One-Transistor) SRAM (Static Random Access Memory) device and applications of such 1-T (One-Transistor) SRAM device are described herein. The one-transistor SRAM can statically maintain valid data without losing accurate storing voltage. The one-transistor can also be accessed synchronously or asynchronously without the interference of requiring refreshing operation. The operation method also applied to a DRAM (Dynamic Random Access Memory) array or other dynamically accessing memory array that requires periodic refresh operations. The operation method and applications thereof handle external accesses and refresh operations such that the refresh operations do not interfere with the external accesses under any situation. Under such mechanism, a synchronous or an asynchronous SRAM compatible device can be built from DRAM or 1-Transistor cells.

Figure 1C:
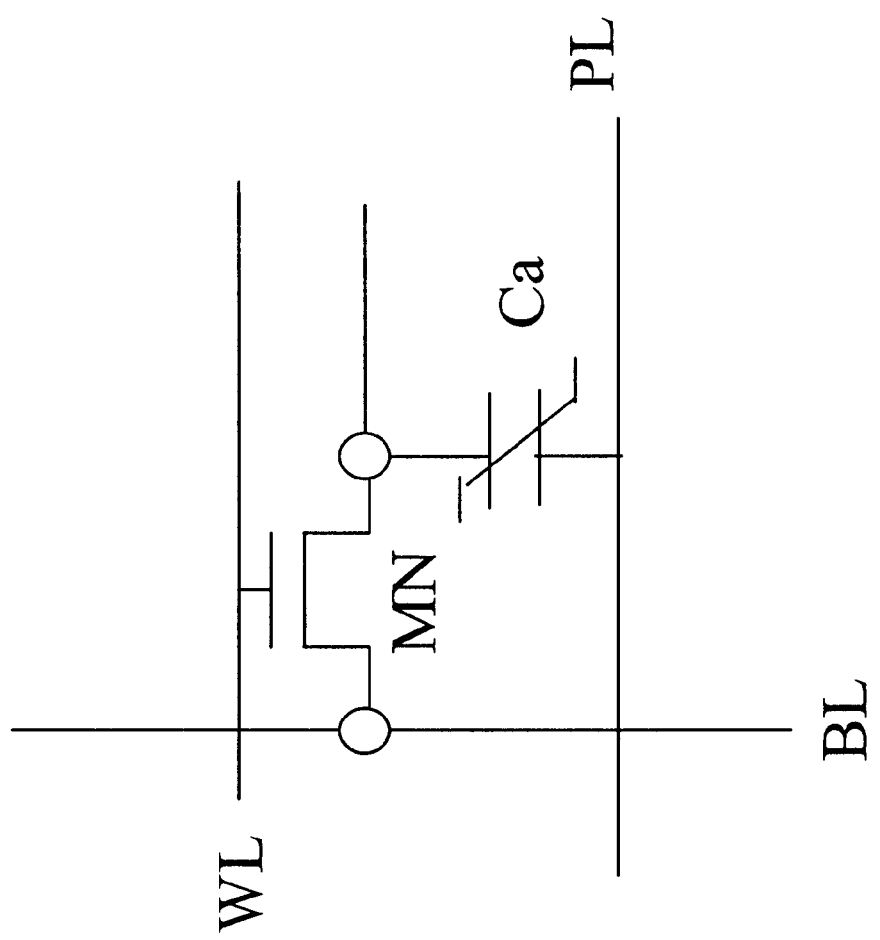
Figure 2B:
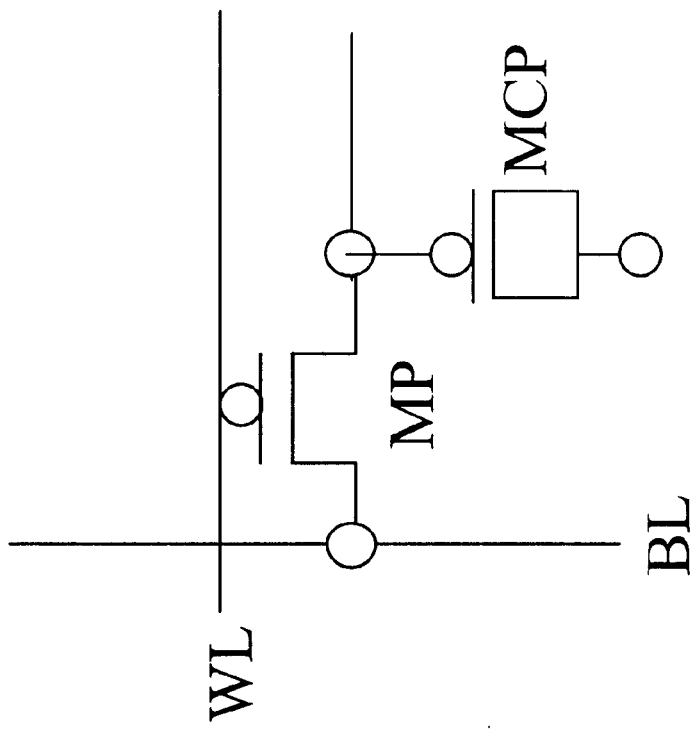
Figure 2A:
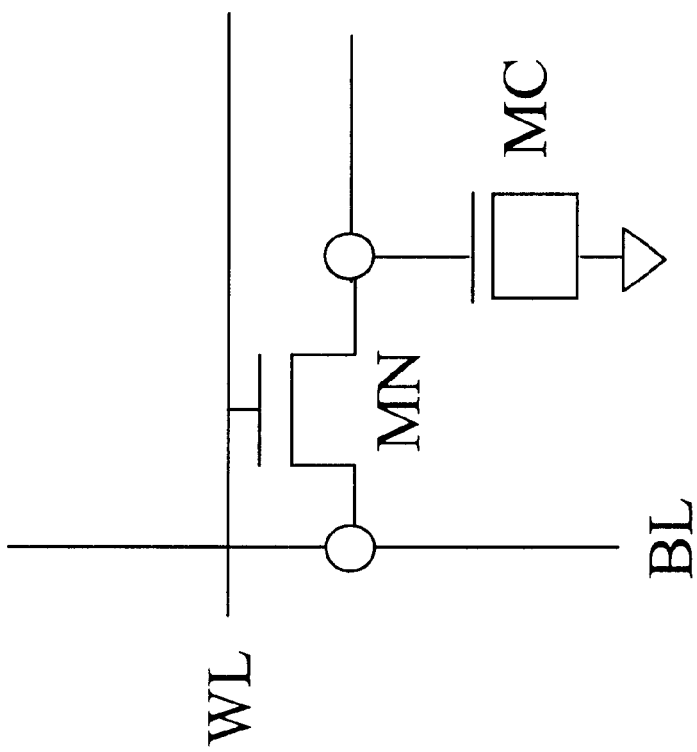

As shown in FIGS. 1A, 1B, 1C, 2A and 2B, which are dynamically storing memory cells with only one transistor and one capacitor. The capacitors, as shown in FIGS. 1A, 1B and 1C for capacitors Ca or as shown in FIGS. 2A and 2B for MOS capacitors (MC), are used for storing data in the memory cells. The capacitors Ca can be capacitors manufactured by a FRAM (Ferroelectric random-access memory) process (as shown in FIG. 1C, a plane voltage PL is provided for the ferroelectric capacitor Ca), DRAM or MIM (metal-insulator-metal) capacitor process. Either polysilicon and metal-insulator-metal (MIM) capacitors can be used for the capacitors. The MIM capacitor module, which is inserted into the backend process of integrated circuit manufacturing, results in a very low capacitance density.

These transistors, as shown in FIGS. 1A and 2A for n-channel MOS (NMOS) transistors MN or as shown in FIGS. 1B and 2B for p-channel MOS (PMOS) transistors MP, are used for pass transistors, each of which is controlled by the word line (WL). By addressing a selected bit line BL and the word line WL, the memory cell can be read, written or refreshed in accordance with requirements and designs. However, if such memory cells are used for SRAM memory cells, there are some concerns that should be considered. A first consideration for such a 1-T SRAM cell is trying to find out a solution for performing the read/write operation and the refresh operation without any interference with each other.

Figure 3:
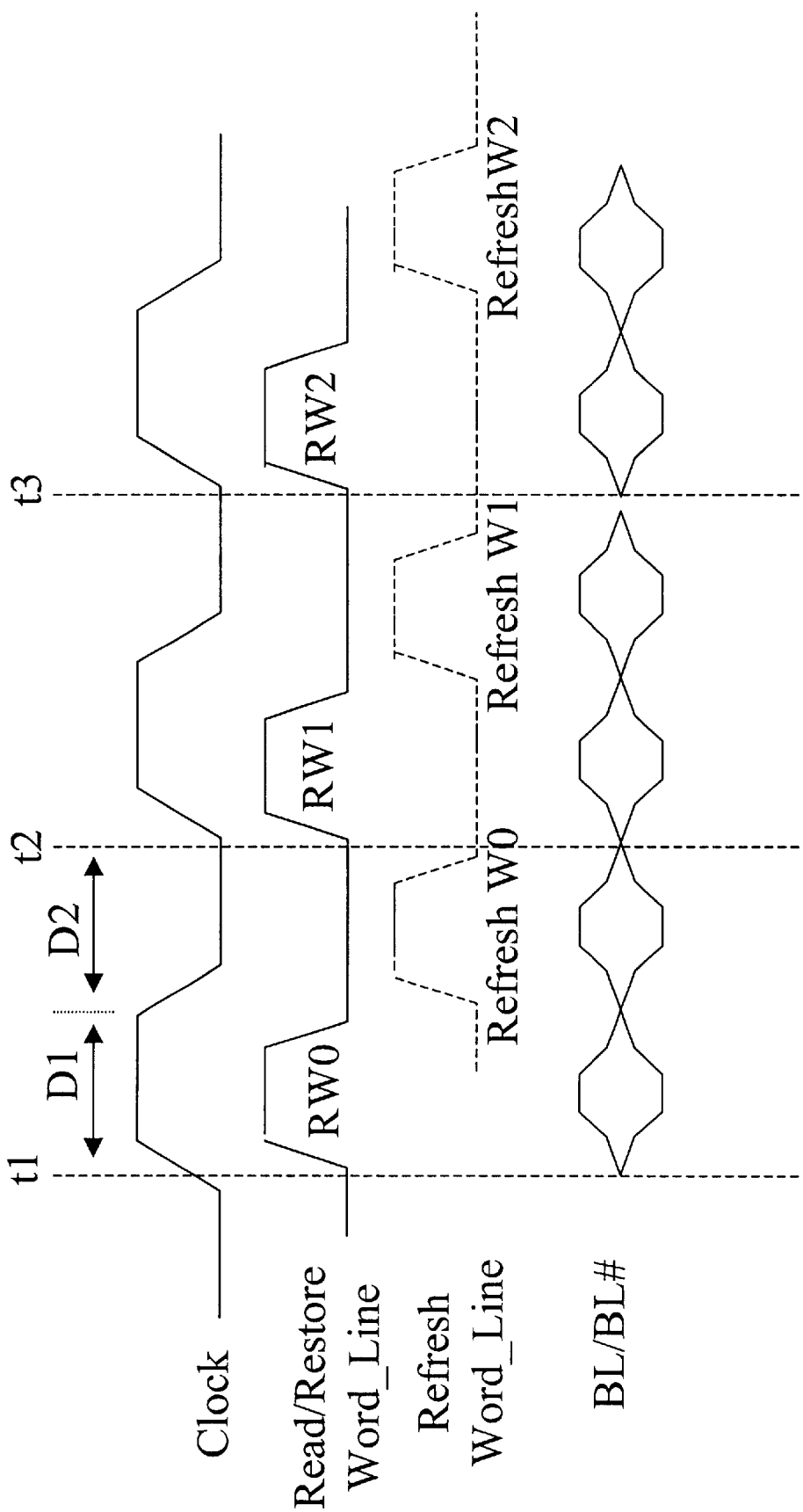
FIG. 3 is a waveform diagram of the timing of various signals during read/write and refresh operations in accordance with an embodiment for a synchronous or an asynchronous 1-T SRAM device of the invention.

Referring to FIG. 3, which is a waveform diagram of the timing of various signals during read/write and refresh operations in accordance with an embodiment for a synchronous or an asynchronous 1-T SRAM device of the invention. In such SRAM device, a hidden refresh can be used for the refresh operation. The hidden refresh method can be, for example, a wave-pipeline technique. In the 1-T SRAM device, the read/restore operation and the refresh operation are performed in accordance with operation clocks. Each of operation clocks is well divided into two portions, for example, a first portion D1 when the operation clock is in a high level and a second portion D2 when the operation clock is in a low level.

For one preferred embodiment of the invention, as shown in FIG. 3, the first portion D1 is used for read/restore operation of dynamically accessing memory cell, and the second portion D2 is used for refresh operation. Time duration of the first portion of the operation clock is sufficient enough or more for a read/restore operation. Time duration of the second portion of the operation clock is sufficient enough or more for a refresh operation. Alternative, the first portion D1 can also be used for refresh operation, and the second portion D2 can be used for read/restore operation. For such embodiment, the 1-T SRAM can be synchronously accessing without interference with the read/restore operation and the refresh operation.

Figure 4:
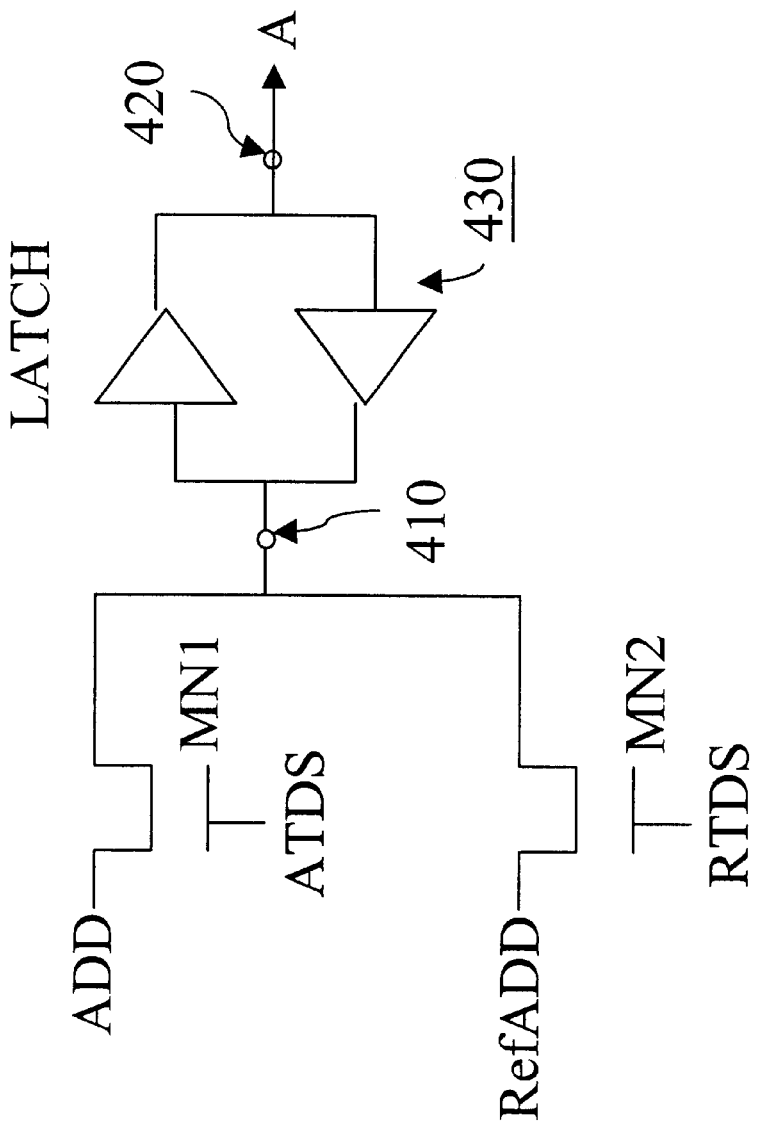
FIG. 4 is a schematic diagram of an implementation for selecting an address for a synchronously or an asynchronous 1-T SRAM to perform a read/write operation or a refresh operation.

Refer to FIG. 4, which shows a 1-T SRAM which can synchronously or asynchronously perform a read/write operation and a refresh operation without any interference with each other. Abbreviated terminologies shown in FIG. 4 are introduced first. "ADD" represents an access address input from address pins when chip is enabled and an access operation is activated by an external device. The access operation includes reading data from or writing data to memory cells of the enabled chip. "RefADD" represents an address counted from, for example, a refresh counter, and is used for providing time controlling of refresh operation of such 1-T SRAM device. "A" represents a final address (resultant address) chosen from one of the refreshing address or the access address."ATD" represents a transition pulse generated by an address transition detector for read/write operation. "RTD" represents a refresh pulse generated by a rising edge of a refresh clock provided for refresh operation of the 1-T SRAM device.

If a rising edge of the transition pulse ATD is detected early than a rising edge of the refresh pulse RTD within a time period Ta, which is long enough for accomplishing the read/write operation, it means that the read/write operation is performed before the refresh operation. That is, the time of the rising edge of the transition pulse ATD is leading the rising edge of the refresh pulse RTD not longer than the time period Ta. An "ABR" pulse is generated to represent performing the read/write operation before the refresh operation, which is denoted ATD before RTD. An "ATDS" pulse is generated at the same time as the rising edge of the transition pulse ATD is detected. That is, ATDS is equal to ATD at this stage. A "RTDS" is generated later till at least the time period Ta after the time of the rising edge of the transition pulse ATD being issued.

If a rising edge of the refresh pulse RTD is detected early than a rising edge of the transition pulse ATD within a time period Tr, which is long enough for accomplishing the refresh operation, it means that the refresh operation is performed before the read/write operation. That is, the time of the rising edge of the refresh pulse RTD is leading the rising edge of the transition pulse ATD not longer than the time period Tr. An "RBA" pulse is generated to represent performing the refresh operation before the read/write operation, which is denoted RTD before ATD. A "RTDS" pulse is generated at the same time as the rising edge of the refresh pulse RTD is detected. That is, RTDS is equal to RTD at this stage. A "ATDS" is generated later till at least the time period Tr after the time of the rising edge of the transition pulse ATD being issued.

If RTD and ATD are occurred too close to each other, such that the ABR and RBA are both detected, one solution can be that RBA being overridden by ABR, or that ABR being overridden by RBA, which depends on design desired. If the design is that the read/write operation surpasses the refresh operation in any situation, the ABR will override the RBA. The ATDS is equal to ATD and the RTDS is generated later till at least the time period Ta after the time of the rising edge of the transition pulse ATD being issued. If the design is that the refresh operation surpasses the read/write operation in any situation, the RBR will override the ABR. The RTDS is equal to RTD and the ATDS is generated later till at least the time period Tr after the time of the rising edge of the refresh pulse RTD being issued.

For one embodiment, the ADD, RefAdd, ATDS and RTDS can be implemented by a simple circuit as shown in FIG. 4. Two transistors MN1 and MN2 are respectively provided for controlling the operations of refresh and read/write. A gate terminal of transistor MN1 is connected to the ATDS signal and, in the same manner, a gate terminal of transistor MN2 is connected to the RTDS signal. One of source/drain terminals of MN1 is connected to the ADD and the other source/drain terminal of MN1 is connected to a point 410. One of source/drain terminals of MN2 is connected to the RefADD and the other source/drain terminal of MN2 is connected to the same point 410. A resultant address A is obtained at point 420 from the point 410 through a latch circuit 430. As described above, when the ATDS pulse is in a active state, that means that ATD pulse is delayed by the time period Tr, the resultant address will be the RefADD which is the address for the refresh operation of the 1-T SRAM device, when the RTDS pulse is in an active state, which is that RTD pulse is delayed by the time period Ta, the resultant address will be the ADD, which is the address for the read/write operation of the 1-T SRAM device.

Hereafter, different cases are described as followed.

Case I. ATD Before RTD

Figure 5:
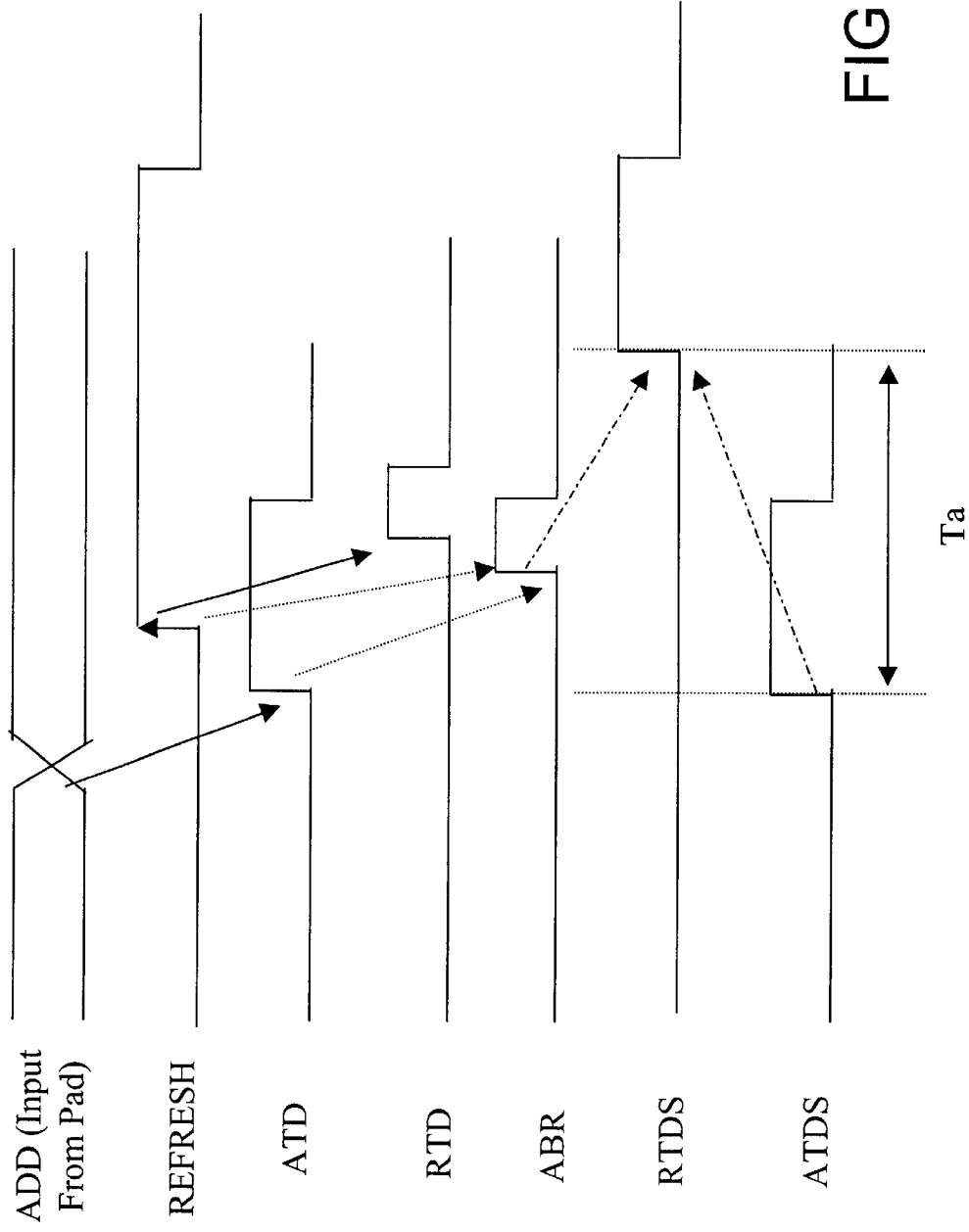
FIG. 5 is a waveform diagram of the timing of various signals during read/write and refresh operations in accordance with a first case of the 1-T SRAM as described in FIG. 4.

As shown in FIG. 5, a case that ATD occurs before RTD is described. When an access address input from address pins when chip is enabled is issued (ADD being activated) before a refresh operation being issued within the time period Ta, the transition pulse ATD is sequentially generated before the refresh pulse RTD being generated. The ATDS pulse is equal to the transition pulse ATD. The resultant address at this stage is the access address ADD input for read/write operation.

An "ABR" pulse is sequentially generated, which means the rising edge of the transition pulse ATD is detected early than the rising edge of the refresh pulse RTD and the read/write operation is performed before the refresh operation. A "RTDS" pulse is generated later than at least a time period Ta after the rising edge of the transition pulse ATD being detected.

Case II. RTD Before ATD

Figure 6:
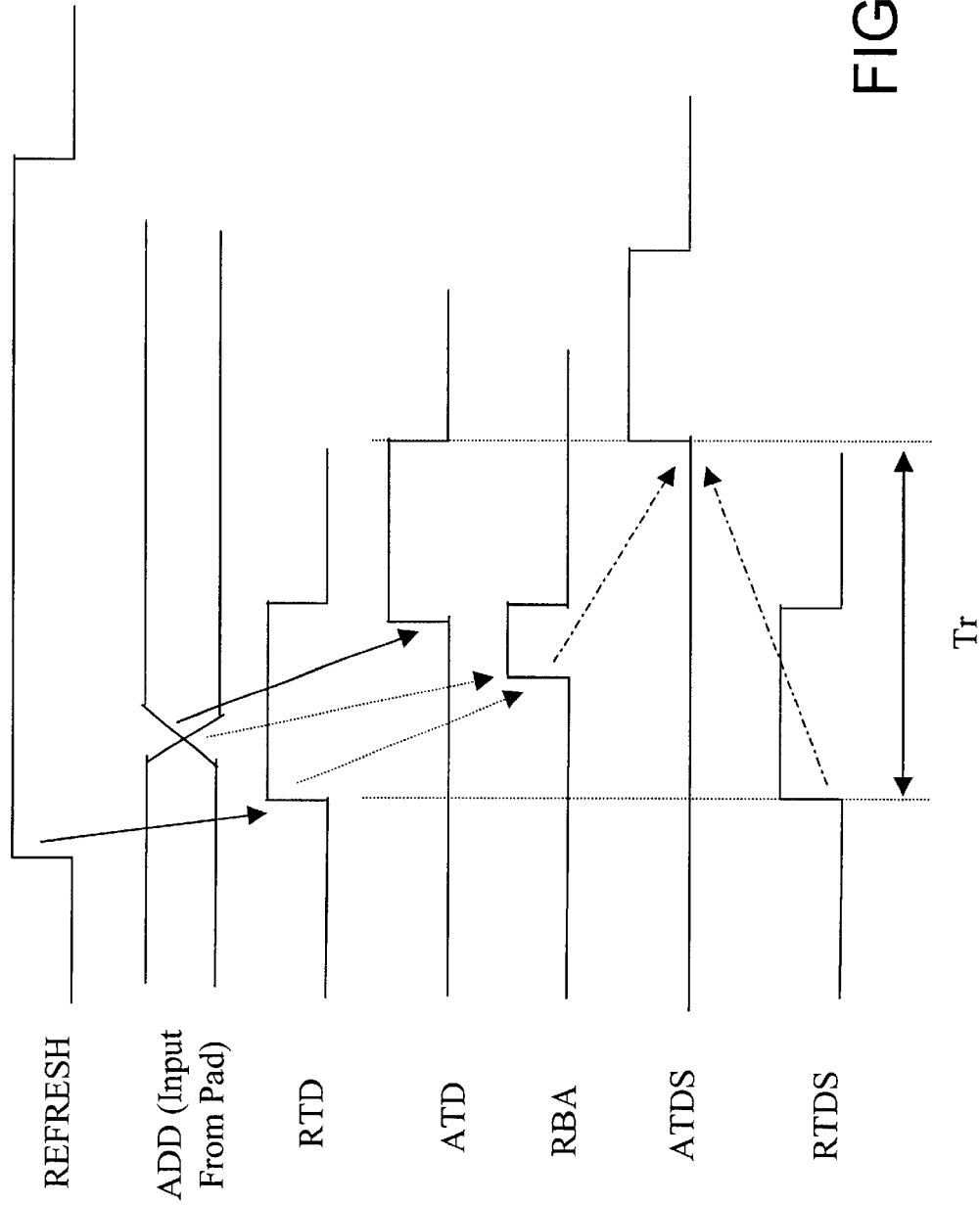
FIG. 6 is a waveform diagram of the timing of various signals during read/write and refresh operations in accordance with a second case of the 1-T SRAM as described in FIG. 4.

As shown in FIG. 6, a case that RTD occurs before ATD is described. When a refresh operation is enabled before an access address input from address pins for a read/write operation within a time period Tr, the refresh pulse RTD is sequentially generated before the transition pulse ATD being generated. The RTDS pulse is equal to the refresh pulse RTD. The resultant address at this stage is the address RefADD for the refresh operation.

An "RBA" pulse is sequentially generated, which means the rising edge of the rising edge of the refresh pulse RTD is detected early than the transition pulse ATD and the refresh operation is performed before the read/write operation. A "ATDS" pulse is generated later than at least the time period Tr after the rising edge of the refresh pulse RTD being detected.

Case III. Chip Deselected

Figure 7:
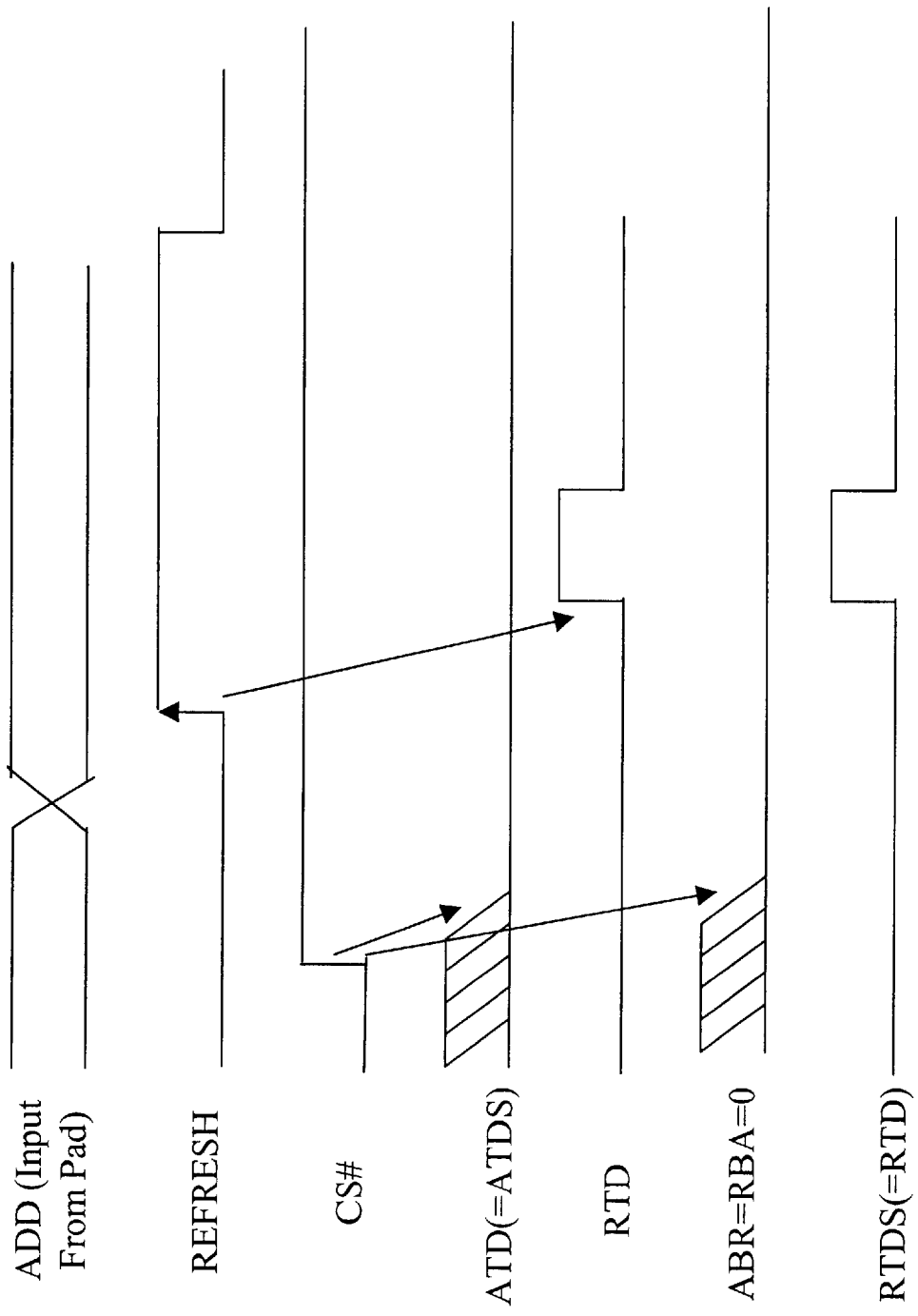
FIG. 7 is a waveform diagram of the timing of various signals during read/write and refresh operations in accordance with a third case of the 1-T SRAM as described in FIG. 4.

Referring to FIG. 7, showing a case that when the chip is not selected for accessing data (complement of the chip selected signal #CS is activated). In such situation, the ATD (=ATDS) will not be generated and both ABR and RBA will not be generated. When a refresh operation is enabled, the refresh pulse RTD is sequentially generated in a discretionary manner. The RTDS pulse is equal to the RTD being generated. The resultant address is the address for refresh operation.

Case IV. Read/Write Operation and Refresh Operation Occur At the Same Time

Figure 8:
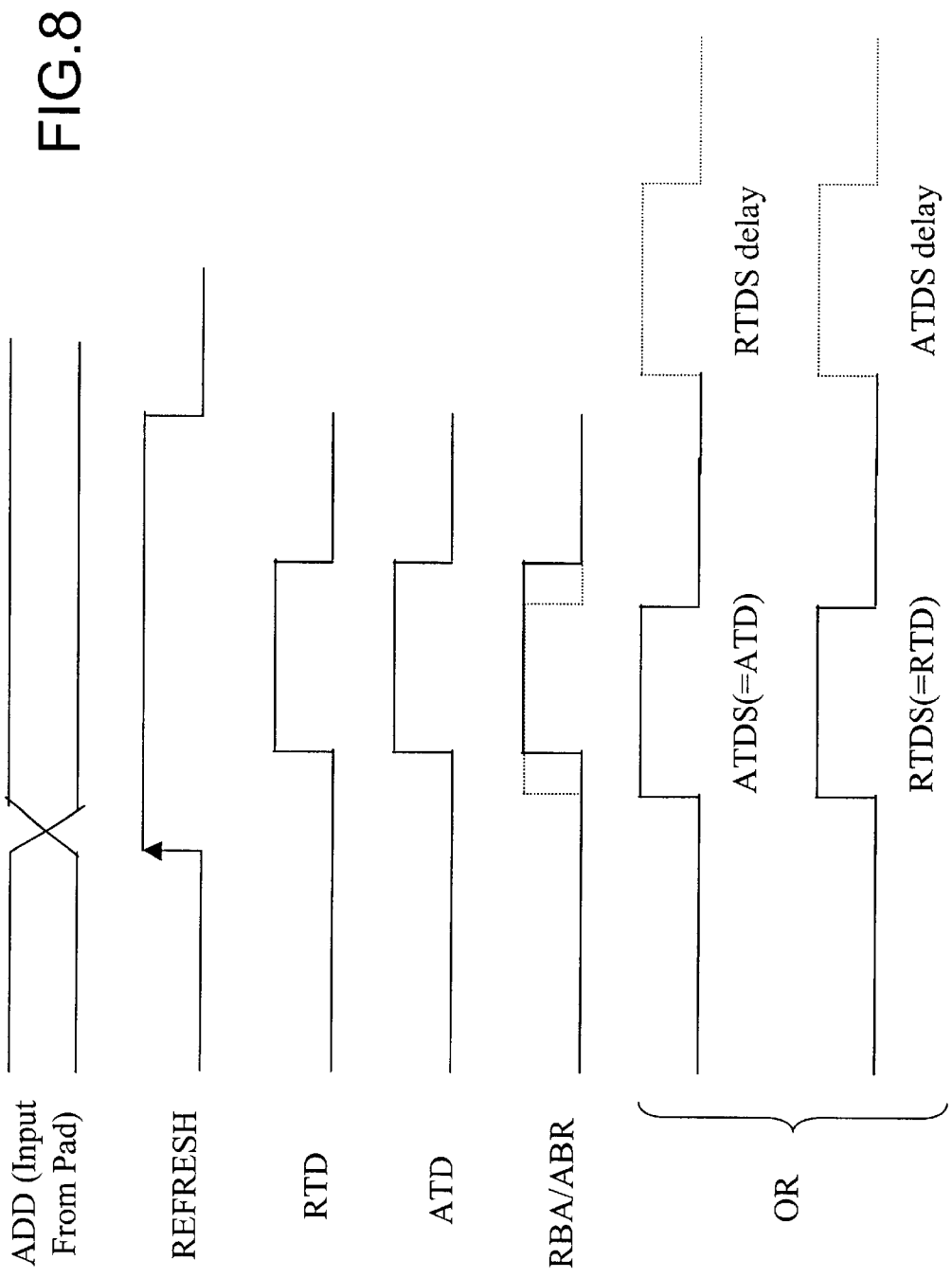
FIG. 8 is a waveform diagram of the timing of various signals during read/write and refresh operations in accordance with a forth case of the 1-T SRAM as descried in FIG. 4.

As shown in FIG. 8, a case that the read/write operation and the refresh operation occur at the same time is described. If the refresh pulse RTD and transition pulse ATD are enabled too close to each other, such that the ABR and RBA are both detected, one solution can be that RBA being overridden by ABR, or that ABR being overridden by RBA, which depends on design. In one case that ATDS is generated and the RTDS is delayed after the read/write operation is accomplished, which means that RTDS will be generated later till at least the time period Ta after the rising edge of the transition pulse ATD being detected. In another case that RTDS is enabled and the ATDS is delayed after the refresh operation is accomplished, which means that ATDS will be generated later till at least the time period Tr after the rising edge of the refresh pulse RTD being detected.

Case V. RTD Before ATD by>Tr

Figure 9:
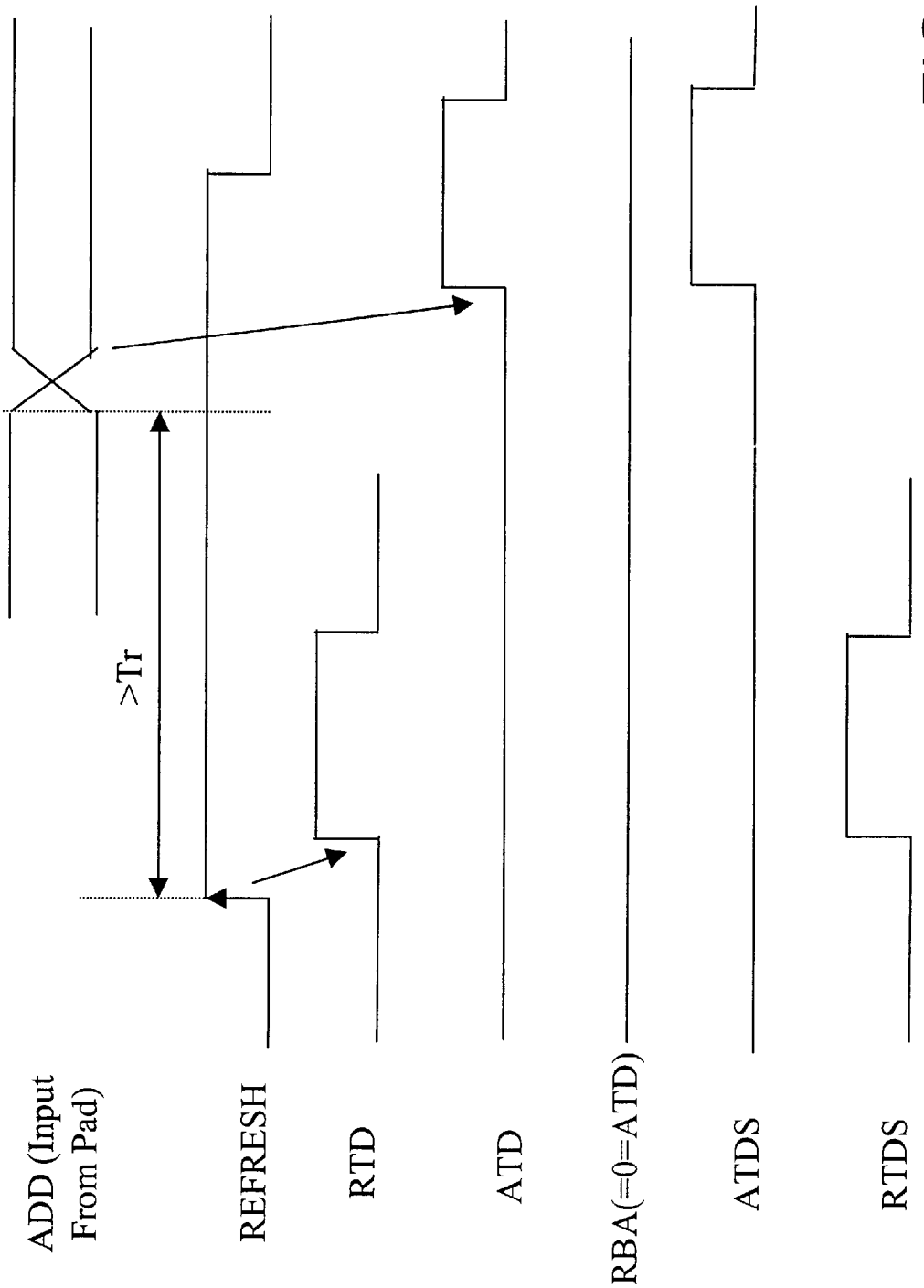
FIG. 9 is a waveform diagram of the timing of various signals during read/write and refresh operations in accordance with a fifth case of the 1-T SRAM as described in FIG. 4.

As shown in FIG. 9, a case that RTD occurs before ATD by a time period larger than Tr is described. When a refresh operation is enabled before an address input from address pins by at least the time period larger than Tr, RTD is sequentially generated before ATD being generated in a discretionary manner. That means that the refresh operation has been accomplished before the ATD is generated. The RTDS pulse is generated in accordance with the RTD. The resultant address at this stage is the address RefADD for the refresh operation. The status of the RBA pulse will be the same as ABR pulse in a logic low status at this stage.

Case VI. ATD Before RTD by>Ta

In a case that ATD occurs before RTD by a time period larger than TA is described. When an access address input from address pins is enabled before a refresh operation by at least the time period larger than TA, the transition pulse ATD is sequentially enabled before the refresh pulse RTD being generated in a discretionary manner. That means that the read/write operation will be accomplished before the RTD is generated. The ATDS pulse is generated in accordance with the ATD pulse. The resultant address at this stage is the access address for the read/write operation. The status of the "ABR" pulse will not be generated at this case.

It will be apparent to those skilled in the art that various modifications and variations can be made to the structure of the present invention without departing from the scope or spirit of the invention. In view of the forgoing, it is intended that the present invention cover modification and variation of this invention provided they fall within the scope of the following claims and their equivalents.

What is claimed is:

1. An operation method of a static random access memory (SRAM) device, the SRAM device having a plurality of memory cells, each of the memory cells being periodically refreshed to retain valid data, the operation method comprising:

receiving an access address and a refresh address for the SRAM device, the access address being used for accessing data stored in the SRAM device and the refresh address being used for periodically refreshing the memory cell in the SRAM; and detecting whether a transition pulse and a refresh pulse being generated, the transition pulse being generated by an address transition detector when a read/write operation is issued, the refresh pulse being generated in response to a refresh clock being in an active state, wherein if the transition pulse being generated before the refresh pulse being generated within a first time period, the access address being used to access data stored in the SRAM device at the time of the rising edge of the transition pulse, the refresh address being not to be used to refresh the memory cell of the SRAM device in accordance with the refresh address until at least the first period later after the rising edge of the transition pulse being issued, wherein the first time period is a time period sufficient enough to accomplish the read/write operation, if the refresh pulse being generated before the transition pulse being generated within a second time period, the refresh address being used to refresh the memory cells of the SRAM device in accordance with the refresh address at the time of the rising edge of the refresh pulse, the access address being not to be used to access data stored in the memory cell of the SRAM device in accordance with the access address until at least the second period later after the rising edge of the refresh pulse being issued, wherein the second time period is a time period sufficient enough to accomplish the refresh operation.

2. The operation method of a SRAM device according to claim 1, wherein in the step of detecting whether the transition pulse and the refresh pulse being generated, if the transition pulse being generated before the refresh pulse being generated larger than the first time period, the access address being used to access data stored in the SRAM device at the time of the rising edge of the transition pulse, the refresh address is used to refresh the memory cell of the SRAM device in accordance with the refresh address after the read/write operation being accomplished.

3. The operation method of a SRAM device according to claim 1, wherein in the step of detecting whether the transition pulse and the refresh pulse being generated, if the refresh pulse being generated before the transition pulse being generated larger than the second time period, the refresh address being used to refresh the memory cells of the SRAM device in accordance with the refresh address at the time of the rising edge of the refresh pulse, the access address being used to access data stored in the memory cell of the SRAM device in accordance with the access address after the refresh operation being accomplished.

4. An operation method of a static random access memory (SRAM) device, the SRAM device having a plurality of memory cells, each of the memory cells being periodically refreshed to retain valid data, the operation method comprising:

receiving an access address and a refresh address for the SRAM device, the access address being used for accessing data stored in the SRAM device and the refresh address being used for periodically refreshing the memory cell in the SRAM; and detecting whether a transition pulse and a refresh pulse being generated, the transition pulse being generated in response to a read/write operation being issued, the refresh pulse being generated in response to a refresh clock being transited to an active state, wherein if the transition pulse being generated before the refresh pulse being generated, the access address being used to access data stored in the SRAM device at the time of the rising edge of the transition pulse, the refresh address being used to refresh the memory cell of the SRAM device in accordance with the refresh address after at least a first time period later than the rising edge of the transition pulse being issued, wherein the first time period is a time period sufficient enough to accomplish the read/write operation, if the refresh pulse being generated before the transition pulse being generated, the refresh address being used to refresh the memory cells of the SRAM device in accordance with the refresh address at the time of the rising edge of the refresh pulse, the access address being used to access data stored in the memory cell of the SRAM device in accordance with the access address after at least a second period later than the rising edge of the refresh pulse being issued, wherein the second time period is a time period sufficient enough to accomplish the refresh operation.

5. An operation method of a static random access memory (SRAM) device, the SRAM device having a plurality of memory cells, each of the memory cells being periodically refreshed to retain valid data, the operation method comprising:

receiving an access address and a refresh address for the SRAM device, the access address being used for accessing data stored in the SRAM device and the refresh address being used for periodically refreshing the memory cell in the SRAM; and detecting whether a transition pulse and a refresh pulse being generated, the transition pulse being generated in response to a read/write operation being issued, the refresh pulse being generated in response to a refresh clock being transited to an active state, wherein if the transition pulse being generated before the refresh pulse being generated, the access address being used to access data stored in the SRAM device at the time of the rising edge of the transition pulse, the refresh address being used to refresh the memory cell of the SRAM device in accordance with the refresh address after the read/write operation being accomplished, if the refresh pulse being generated before the transition pulse being generated, the refresh address being used to refresh the memory cells of the SRAM device in accordance with the refresh address at the time of the rising edge of the refresh pulse, the access address being used to access data stored in the memory cell of the SRAM device in accordance with the access address after the refresh operation being accomplished.

6. The operation method of a SRAM device according to claim 5, wherein in the step of detecting whether the transition pulse and the refresh pulse being generated, if the transition pulse being generated before the refresh pulse being generated larger than a first time period, the access address being used to access data stored in the SRAM device at the time of the rising edge of the transition pulse, the refresh address is used to refresh the memory cell of the SRAM device in accordance with the refresh address after the read/write operation being accomplished, wherein the first time period is a time period sufficient enough to accomplish the read/write operation.

7. The operation method of a SRAM device according to claim 5, wherein in the step of detecting whether the transition pulse and the refresh pulse being generated, if the refresh pulse being generated before the transition pulse being generated larger than a second time period, the refresh address being used to refresh the memory cells of the SRAM device in accordance with the refresh address at the time of the rising edge of the refresh pulse, the access address being used to access data stored in the memory cell of the SRAM device in accordance with the access address after the refresh operation being accomplished, wherein the second time period is a time period sufficient enough to accomplish the refresh operation.

8. An operation method of a static random access memory (SRAM) device, the SRAM device having a plurality of memory cells, each of the memory cells being periodically refreshed to retain valid data, the operation method comprising:

receiving an access address, a refresh address and a chip deselected signal for the SRAM device, the access address being used for accessing data stored in the SRAM device and the refresh address being used for periodically refreshing the memory cell in the SRAM device, the chip deselected signal being use to indicate the SRAM device being selected for data processing; and detecting the chip deselected signal being in an active state and detecting whether a transition pulse, a refresh pulse being generated, the transition pulse being generated by an address transition detector when a read/write operation is issued, the refresh pulse being generated in response to a refresh clock being in an active state, wherein if the deselected signal being not in the active state and the transition pulse being generated before the refresh pulse being generated within a first time period, the access address being used to access data stored in the SRAM device at the time of the rising edge of the transition pulse, the refresh address being not to be used to refresh the memory cell of the SRAM device in accordance with the refresh address until at least the first period later after the rising edge of the transition pulse being issued, wherein the first time period is a time period sufficient enough to accomplish the read/write operation, if the deselected signal being not in the active state, or if the refresh pulse being generated before the transition pulse being generated within a second time period, the refresh address being used to refresh the memory cells of the SRAM device in accordance with the refresh address at the time of the rising edge of the refresh pulse.

9. An operation method of a static random access memory (SRAM) device, the SRAM device having a plurality of memory cells, each of the memory cells being periodically refreshed to retain valid data, the operation method comprising:

receiving an access address, a refresh address and a chip deselected signal for the SRAM device, the access address being used for accessing data stored in the SRAM device and the refresh address being used for periodically refreshing the memory cell in the SRAM device, the chip deselected signal being use to indicate the SRAM device being selected for data processing; and detecting the chip deselected signal being in an active state and detecting whether a transition pulse and a refresh pulse being generated, the transition pulse being generated in response to a read/write operation being issued, the refresh pulse being generated in response to a refresh clock being transited to an active state, wherein if the deselected signal being not in the active state and the transition pulse being generated before the refresh pulse being generated, the access address being used to access data stored in the SRAM device at the time of the rising edge of the transition pulse, the refresh address being used to refresh the memory cell of the SRAM device in accordance with the refresh address after the read/write operation being accomplished, if the deselected signal being in the active state or if the refresh pulse being generated before the transition pulse being generated, the refresh address being used to refresh the memory cells of the SRAM device in accordance with the refresh address at the time of the rising edge of the refresh pulse.

* * * * *